Figure 1:
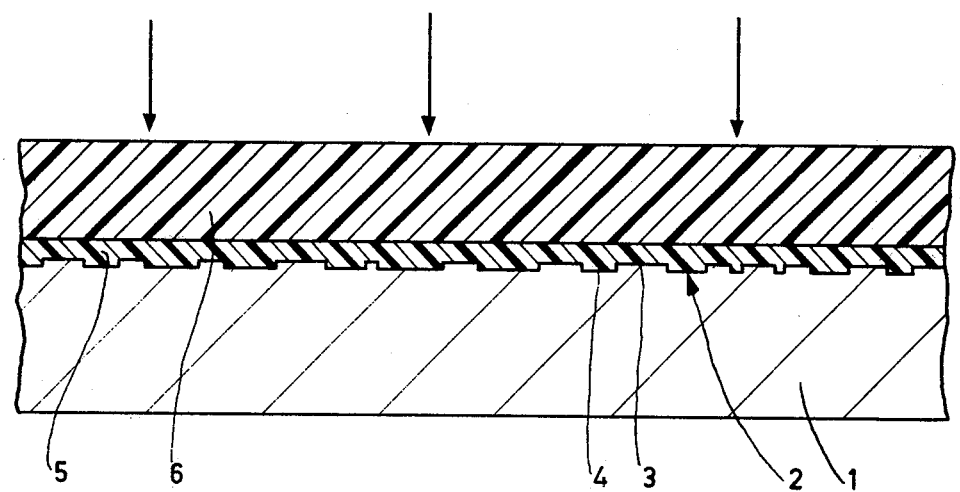

United States Patent [19]
Lippits et al.

[11] 4,272,574
[45] Jun. 9, 1981

[54] OPTICALLY READABLE INFORMATION DISC

[75] Inventors: Gerardus J. M. Lippits; Arnoldus J. M. van den Broek; Rinse Dijkstra, all of Eindhoven, Netherlands

[73] Assignee: U.S. Philips Corporation, New York, N.Y.

[21] Appl. No.: 926,952

[22] Filed: Jul. 20, 1978

[30] Foreign Application Priority Data

Apr. 17, 1978 [NL] Netherlands .......................... 7804036

[51] Int. Cl.³ ............................................... G11B 7/24
[52] U.S. Cl. .................................... 428/64; 346/76 L; 346/77 R; 346/135.1; 346/137; 358/128.5; 428/172; 428/412; 428/419; 428/522; 428/413
[58] Field of Search ............... 346/135.1, 76 L, 77 R; 204/159.18; 358/128, 129; 156/272; 264/1; 428/64, 65, 413, 482, 519, 522, 412, 419, 172; 427/54.1

[56] References Cited

U.S. PATENT DOCUMENTS

| 4,084,020 | 4/1978 | Mathias et al. ................. 204/159.18 |
| 4,126,726 | 11/1978 | Soeding ................................. 156/272 |
| 4,188,433 | 2/1980 | van den Broek et al. ............. 428/64 |

FOREIGN PATENT DOCUMENTS

859711  4/1978  Belgium .

*Primary Examiner*—Stanley S. Silverman
*Attorney, Agent, or Firm*—Norman N. Spain

[57] ABSTRACT

The invention relates to an information disc having a laminated structure which can be read optically. The information disc comprises a transparent substrate which is preferably manufactured from a synthetic resin, for example plexiglass, having thereon a radiation-cured lacquer layer in which the information track is present. The lacquer layer used comprises a radiation-cross linkable protic compound which after curing is aprotic. The lacquer layer preferably comprises a polythiol compound as well as a polyene compound in an equivalent ratio of 1:1.

6 Claims, 2 Drawing Figures

OPTICALLY READABLE INFORMATION DISC

The invention relates to an information disc which has a laminated structure and which can be read optically and comprises a transparent substrate having thereon a layer of a cured resin comprising an information track having a relief structure of information areas situated alternately at a higher and lower level.

Such an information disc is disclosed in Offenlegungsschrift No. 24 43 020. The known disc is manufactured by means of a special silicone rubber matrix obtained by providing a master disc, that is a glass plate having a layer of cured photolacquer in which the information track is provided, with a detaching agent on the side of the photolacquer. A liquid vulcanisable layer of silicone rubber containing 10% by weight of catalyst is then provided on the detaching agent. A glass plate having an adhesive is provided on the silicone rubber layer with its adhesive layer lowermost and the assembly is subjected to higher temperatures of 71°–204° C. The glass plate and connected thereto the cured layer of silicone rubber in which the information track has been duplicated, is finally separated from the master disc. By means of a silicone rubber matrix manufactured in this manner the information disc is made as follows.

A liquid polyurethane resin mixture containing in addition to the resin a thinner and a catalyst is provided on a film or foil of polyester (Mylar) after which the thus coated Mylar film is pressed against the silicon rubber layer of the matrix by means of a pressure roller.

The polyurethane resin is cured, the polyester film with resin being rolled again by means of a heavy roller. The curing time varies from 15–45 minutes dependent on the composition of the resin and on the layer thickness.

As stated on page 14, third paragraph, of the above Offenlegungsschrift, other materials, for example epoxy resins, acryl resins and radiation-polymerisable monomers as described in the Broadbent Patents may also be used in addition to the polyurethane resin. The Broadbent patents, for example, the U.S. Pat. Nos. 3,658,954 and 3,687,664 describe a duplicating process of video discs in which a U.V.-light-polymerisable gaseous monomer, for example acrolein and parylene vapour, is polymerised from the gaseous phase and deposited on a substrate.

The above Offenlegungsschrift also states that the polyurethane resin may be provided on the matrix instead of on the polyester film, the polyester film being rolled over the thinned resin layer.

After curing the polyurethane resin, the polyester foil and the cured resin layer connected thereto and in which the information track has been duplicated, is removed mechanically from the matrix.

In applicants' opinion the known disc has the disadvantage that the accuracy of the information duplicated in the disc, so the conformity of the duplicated information and the original information present in the master disc is not optimum. This is also caused by the use of a silicon rubber matrix during the manufacture of the disc. In fact, when manufacturing the silicon rubber matrix, curing of the rubber takes place at elevated temperature. As a result of differences in thermal expansion between the rubber matrix and master disc to be manufactured, small differences in dimensions may occur. Small differences in dimensions may very detrimentally influence the reproduction quality in particular for the reproduction of video information where a very high resolving power is required. Differences in dimensions between master plate and rubber matrix may also occur as a result of the detaching agent present between the master disc and the silicone rubber. A further disadvantage is the comparatively long curing time of the duplicate (polyurethane with polyester film) in the matrix. Of course the curing time can be shortened by operating at higher temperatures, but in that case the undesired differences in thermal expansion again play a part which deteriorate the transmission of video information and furthermore result in thermal stresses in the duplicate. As a result of these stresses, deformation of the duplicate and loss or deformation of video information may take place in course of time. A further disadvantage is the restricted stability of the resin mixture. Curing begins as soon as the polyurethane resin has been added to the catalyst. It has furthermore been found that the surface of the silicone rubber matrix is easily attached by resins in particular those which comprise polymerisable monomers.

The invention provides an information disc of the kind mentioned in the preamble which does not exhibit the above-mentioned disadvantages and which is characterized in that the resin is a radiation-curable resin which comprises a radiation-cross linkable protic compound which after cross-linking is aprotic or substantially aprotic.

The information track present in the disc is an accurate, true copy of the original information track present in the master disc. The information track usually is spiral-shaped or consists of concentric circles and has a relief structure of areas situated alternately at a higher level, sometimes termed blocks, and areas situated at a lower level, sometimes termed pits. As a result of this the information track obtains a crenelated profile. The longitudinal dimensions of pits and blocks are characteristic of the stored information and vary roughly from one to a few micrometers. The disc is read in phase by means of laser light; the height difference between pits and blocks is one quarter wavelength of the reading light. The disc is preferably read in reflection via the transparent substrate. For this purpose, the radiation-cured resin in which the information track is present is provided with a thin reflection layer, in particular a metal layer, which can be vapour-deposited or be electroless deposited on the resin from a solution. A suitable reflection layer which can very readily be used in the disc according to the invention is a vapour-deposited or electroless deposited silver layer.

The transparent substrate is preferably manufactured from a transparent synthetic resin, for example polymethyl methacrylate, polycarbonate, polyvinyl chloride or copolymers of vinyl chloride-vinyl acetate.

The information disc according to the invention has the additional advantage that during the manufacture thereof no special matrix is required but a usual metal matrix may be used, in particular a matrix manufactured from nickel.

The information disc according to the invention is manufactured more in particular by providing a liquid radiation-curable lacquer containing a radiation-cross linkable protic compound on the metal surface of a matrix which comprises an information track, then providing a transparent substrate on the layer of lacquer, curing the layer of lacquer by radiation via the substrate, and separating from the matrix the substrate and the cured layer of lacquer connected thereto in which the information track has been duplicated.

It will be obvious that, after curing, the layer of lacquer must be connected to the substrate which preferably is manufactured from a synthetic resin and otherwise be detachable from the metal surface of the matrix without damage. Furthermore, upon providing the lacquer it must well wet the metal of the matrix and the substrate plate. The information track of the matrix must be well duplicated by the lacquer layer and upon curing no uncontrollable dimensional differences may occur in the layer of lacquer.

The radiation-cured lacquer used in the information disc according to the invention fulfils these requirements. The radiation-cross linkable protic compound used in the lacquer is preferably a compound which comprises a reactive hydrogen atom which is split off by radiation.

A suitable cross-linkable protic compound which splits off protons upon radiation is a polythiol compound which comprises per molecule two or more protic thiol groups (—SH groups).

In a favourable embodiment the lacquer also comprises a radiation-cross linkable polyene compound which comprises per molecule two or more ethene groups (—CH=CH groups).

Polythiol compounds and polyene compounds are sufficiently known from literature and are commercially available. Many suitable polythiol and polyene compounds are stated in the so-called Grace patents. Reference may be had in particular to the U.S. Pat. Nos. 3,697,395; 3,697,396; 3,697,397; 4,008,341 in the name of W. R. Grace and Co., New York, which are hereby incorporated by reference.

Those skilled in the art can make a suitable choice from the known and available polythiol and polyene compounds. It can be found out by simple experiments whether a selected polythiol-polyene mixture, after curing with, for example, U.V. light, provides a sufficient adhesion to the selected transparent substrate and can be detached from the selected matrix. According to applicants, good results are obtained in particular with comparatively low-viscous liquid mixtures of polythiols and polyenes the viscosity of which, by way of example, is lower than 100 cP and preferably is lower than 20 cP. Mixtures of polythiols and polyenes satisfying this requirement as a rule comprise low-molecular compounds in which the polythiol compound preferably has a maximum molecular weight of 1000 and the polyene compound has a maximum molecular weight of 500.

Very suitable resins comprise a mixture of a di-, tri- of tetrathiol compound and a diene, triene or tetraene compound.

This applies in particular to a mixture of a diene compound and a trithiol or tetrathiol compound in an equivalent ratio of 2:1 to 1:2, as well as to a mixture of a triene compound and a dithiol or trithiol compound also in an equivalent ratio of 2:1 to 1:2.

Equivalent ratio is to be understood to mean the ratio between gramequivalents of the "ene compound" (—CH=CH group) and gramequivalents of the thiol compound (—SH group).

It has been found that with an equivalent ratio "ene-thiol" which is higher than 2:1 or lower than 1:2, the exposure times for curing the resin become rather long and often are more than 30 minutes.

In particular with equivalent ratio's "ene-thiol" of approximately 1:1, short exposure times of at most 5 minutes may be used.

A very interesting radiation-curable lacquer comprises a mixture of a trithiol compound and a triene compound. Also with equivalent ratios "ene-thiol" of 2:1 or of 1:2, very short exposure times of a few minutes are also sufficient.

Examples of useful polythiol compounds are esters of thioglycolic acid, 2-mercaptopropionic acid or 3-mercaptopropionic acid and polyhydroxy compounds. Specific suitable polythiol compounds are inter alia pentaerytritoltetrathioglycolate, pentaerytritoltetra (3-mercaptopropionate), trimethylolpropanetri (3-mercaptopropionate), trimethylolpropanetrithioglycolate, ethyleneglycoldimercaptopropionate, ethyleneglycoldimercaptoacetate and ethyleneglycoldithioglycolate.

Examples of suitable polyene compounds are esters of polyhydroxy compounds and more-basic acrylic acids and in particular allyl esters or allyl ethers of, respectively, multibasic acids or polyhydroxy compounds. Specific representatives of suitable polyenes are alkanedioldiacrylates, such as 1,3-butanedioldiacrylate and 1,3-hexanedioldiacrylate, furthermore tetraethyleneglycoldiacrylate, tripropyleneglycoldiacrylate, trimethylolpropanetriacrylate, diallyloxalate, diallyldiglycolcarbonate, diallylmaleinate, diallyldiglycolate, diallylmalonate, triallyltrimellitate and triallylisocyanurate.

The lacquer used in the information disc according to the invention comprises, in addition to the already mentioned ingredients, such as polythio compound and polyene compound, also a photosensitive initiator or activator which initiates the desired radical formation and subsequent polymerisation. A suitable initiator is a proton abstraction agent, such as a phenone, quinone, xanthenone anthracenone or naphthone compound, for example, benzophenone or benzoineisobutylether. The quantity of initiator is approximately 0.5 to 5% by weight. The lacquer may also comprise the usual additives such as an antioxydant, for example, the 2,6-di-tert-butyl-4-methylphenol known commercially as Ionol in a quantity of 0.05–0.5% by weight, as well as a stabiliser, such as a 30% aqueous solution of phosphorous acid in a quantity of 0.05–0.5% by weight of phosphorous acid.

Figure 2:
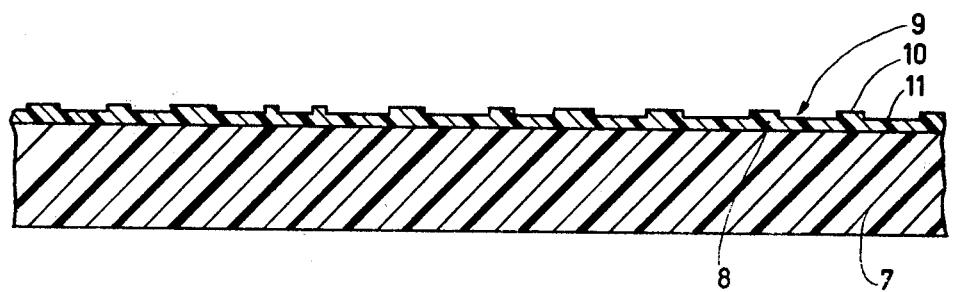

The invention will now be described in greater detail with reference to the drawing, in which FIG. 1 is a cross-sectional view of a matrix having thereon a radiation-curable lacquer and a substrate, FIG. 2 is a cross-sectional view of an information disc according to the invention.

Reference numeral 1 in FIG. 1 denotes a nickel matrix which has on one side an information track 2 which has a crenelated profile or areas situated at a higher and a lower level, respectively, blocks 3 and pits 4. The longitudinal dimensions of blocks 3 and pits 4 are different in agreement with the stored information and are approximately from one to a few micrometers. The difference in height between blocks and pits is roughly 0.2–0.4 μm.

A thin layer 5 (approximately 25 μm) of a U.V. light-curable lacquer which comprises a polyene compound, a polythiol compound, as well as the following additives:

1% by weight of benzophenone
0.1% by weight of 2.6-dibutyl-4-methylphenone 0.1% by weight of $H_3PO_3$ in a 30% solution in water is present on the surface of the matrix comprising the information track.

Various lacquers have been used which in addition to the above additives comprise the polyene and polythiol compounds recorded in the following table.

TABLE

Polyene and polythiol compounds used in lacquer

| Lacquer number | polyene compound | polythiol compound | equivalent ratio polyene-polythiol |
|---|---|---|---|
| 1 | diallylmaleinate | ethyleneglycoldimercaptopropionate | 1:1 |
| 2 | diallylmaleinate | trimethylolpropane trimercaptopropionate | 1:1 |
| 3 | diallylmaleinate | trimethylolpropane trimercaptopropionate | 2:1 |
| 4 | diallylmaleinate | trimethylolpropane trimercaptopropionate | 1:2 |
| 5 | diallylmaleinate | pentaerythritoltetrathioglycolate | 1:1 |
| 6 | diallylmaleinate | pentaerythritoltetrathioglycolate | 1:2 |
| 7 | diallyldiglycolcarbonate | trimethylolpropane-trimercaptopropionate | 1:1 |
| 8 | diallyldiglycolcarbonate | trimethylolpropane-trimercaptopropionate | 2:1 |
| 9 | diallyldiglycolcarbonate | pentaerythritoltetrathioglycolate | 1:1 |
| 10 | diallyldiglycolcarbonate | pentaerythritoltetrathioglycolate | 2:1 |
| 11 | diallyloxalate | trimethylolpropane-trimercaptopropionate | 1:1 |
| 12 | diallyloxalate | trimethylolpropane trimercaptopropionate | 2:1 |
| 13 | diallyloxalate | pentaerythritoltetrathioglycolate | 1:1 |
| 14 | diallyldiglycolate | trimethylolpropane-trimercaptopropionate | 1:1 |
| 15 | diallyldiglycolate | trimethylolpropane-trimercaptopriopionate | 2:1 |
| 16 | diallyldiglycolate | pentaerythritoltetrathioglycolate | 1:1 |
| 17 | diallyldiglycolate | pentaerythritoltetrathioglycolate | 2:1 |
| 18 | diallylmalonate | trimethylolpropane-trimercaptopropionate | 1:1 |
| 19 | diallylmalonate | trimethylolpropane-trimercaptopropionate | 2:1 |
| 20 | diallylmalonate | pentaerythritoltetrathioglycolate | 1:1 |
| 21 | diallylformal | trimethylolpropanetrimercaptopropionate | 1:1 |
| 22 | diallylformal | pentaerythritoltetrathioglycolate | 1:1 |
| 23 | triallylmellitate | ethyleneglycoldimercaptopropionate | 1:1 |
| 24 | triallylmellitate | ethyleneglycoldimercaptopropionate | 2:1 |
| 25 | triallylmellitate | trimethylolpropanetrimercaptopropionate | 1:2 |
| 26 | triallylmellitate | trimethylolpropanetrimercaptopropionate | 1:1 |
| 27 | triallymellitate | trimethylolpropanetrimercaptopropionate | 2:1 |
| 28 | triallymellitate | pentaerythritoltetrathioglycolate | 1:1 |
| 29 | triallylisocyanurate | ethyleneglycoldimercaptopropionate | 2:1 |
| 30 | triallylisocyanurate | ethyleneglycoldimercaptopropionate | 1:1 |
| 31 | triallylisocyanurate | trimethylolpropanetrimercaptopropionate | 1:1 |
| 32 | triallylisocyanurate | trimethylolpropanetrimercaptopropionate | 1:1 |
| 33 | triallylisocyanurate | trimethylolpropanetrimercaptopropionate | 2:1 |

A 1 mm thick substrate plate 6 of polymethylmethacrylate was laid on lacquer layer 5 and the lacquer layer was then exposed to ultraviolet light via the substrate 6 in the direction of the arrows.

The exposure time depends inter alia on the composition of the lacquer and the light intensity. When a high-pressure mercury lamp of 500 W (Philips SP 500) and a distance between lamp and substrate of 15 cm was used, an exposure time was used which varied from a few minutes to 30 minutes dependent on the composition of the lacquer as stated in the table. With lacquers containing the polyene compound and the polythiol compound in an aquivalent ratio of 1:1, the exposure time was less than 5 minutes.

After curing the lacquer layer under the influence of the U.V. light, the resulting assembly of substrate 6 and cured lacquer layer 5 connected thereto and comprising the information track was removed from the matrix 1 and provided on the side of the information track with a reflection layer of silver in a thickness of approximately 300 Å.

A cross-sectional view of the information disc thus obtained is shown in FIG. 2 in which the substrate of plexi glass is denoted by reference numeral 7, the cured resin layer by 8, the information track by 9 and the blocks and pits of the information track by reference numerals 10 and 11, respectively. The reflection layer present on the resin layer 8 is not shown.

What is claimed is:

1. An optically readable information disk which having a laminated structure and comprising a relatively thick transparent substrate having laminated thereto a layer of a cured resin comprising an information track having a crenelated profile, said cured resin being the cross-linked substantially aprotic product of a radiation curable lacquer having a viscosity of less than 100 cP comprising a mixture of a cross-linkable protic polythiol compound and a radiation cross-linkable polyene compound.

2. An information disc as claimed in claim 1, characterized in that the polythiol compound has a maximum molecular weight of 1000 and the polyene compound has a maximum molecular weight of 500.

3. An information disc as claimed in claim 1, characterized in that the lacquer comprises a mixture of a di-, tri- or tetrathiol compound and a diene, triene or tetraene compound.

4. An information disc as claimed in claim 3, characterized in that the lacquer comprises a mixture of a diene compound and a trithiol or tetrathiol compound in an equivalent ratio of 2:1 to 1:2.

5. An information disc as claimed in claim 4, characterized in that the equivalent ratio is 1:1.

6. An information disc as claimed in claim 3, characterized in that the lacquer comprises a mixture of a triene compound and a dithiol or trithiol compound in an equivalent ratio of 2:1 to 1:2.

* * * * *